(12) United States Patent
Yamamoto et al.

(10) Patent No.: US 11,387,152 B1
(45) Date of Patent: Jul. 12, 2022

(54) SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Kazuyoshi Yamamoto, Toyama (JP); Hidemoto Hayashihara, Toyama (JP); Kayoko Yashiki, Toyama (JP); Kazuhide Asai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/484,101

(22) Filed: Sep. 24, 2021

(30) Foreign Application Priority Data

Jul. 20, 2021 (JP) .............................. JP2021-119835

(51) Int. Cl.
*H01L 21/66* (2006.01)
*H01L 21/67* (2006.01)

(52) U.S. Cl.
CPC ........ *H01L 22/20* (2013.01); *H01L 21/67248* (2013.01); *H01L 21/67253* (2013.01)

(58) Field of Classification Search
CPC ............... H01L 22/20; H01L 21/67248; H01L 21/67253
See application file for complete search history.

(56) References Cited

U.S. PATENT DOCUMENTS

2015/0170934 A1\* 6/2015 Aderhold ................ H01L 22/12
438/7
2017/0300044 A1 10/2017 Asai et al.

FOREIGN PATENT DOCUMENTS

JP 2017-194951 A 10/2017

\* cited by examiner

*Primary Examiner* — Karen Kusumakar
(74) *Attorney, Agent, or Firm* — Volpe Koenig

(57) ABSTRACT

According to one aspect of the technique, there is provided a technique, including: a process chamber in which a substrate is processed; a memory that stores recipe information describing a procedure that executes the processing of the substrate, process data accumulated during the processing of a plurality of substrates, variation quality data calculated from the process data, and comparison data to be compared with the variation quality data; a monitor configured to monitor the process data; an analyzer configured to compare the variation quality data with the comparison data to obtain a reproduction index indicating a reproducibility of the comparison data, and calculate a correction value of setting information included in the recipe information when the reproduction index is smaller than a predetermined value; and a controller configured to be capable of correcting the setting information included in the recipe information with the correction value.

14 Claims, 8 Drawing Sheets

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2021-119835, filed on Jul. 20, 2021, the entire contents of which are incorporated herein by reference.

TECHNICAL FIELD

The present disclosure relates to a substrate processing apparatus, a method of manufacturing a semiconductor device, and a recording medium.

BACKGROUND

In a substrate processing apparatus used to manufacture a semiconductor device such as an LSI (Large Scale Integrated Circuit) or a DRAM (Dynamic Random Access Memory), when a semiconductor substrate (hereinafter simply referred to as a "substrate") such as a silicon (Si) wafer, it is known to monitor the operating state of the apparatus in order to detect various abnormalities such as apparatus failures and process abnormalities. Further, in the related art, in environments in which a plurality of substrate processing apparatus are connected to each other by a network, in order to execute the same processing in the substrate processing apparatuses, it is known to share various information of one substrate processing apparatus and reproduces the processing by the one substrate processing apparatus in another substrate processing apparatus.

When the information regarding the processing of the one substrate processing apparatus is shared with the another substrate processing apparatus and the processing in the one substrate processing apparatus is reproduced in the another substrate processing apparatus, it is preferable for the another substrate processing apparatus to maintain high reproducibility for the processing by the one substrate processing apparatus from the viewpoint of matching the production quality of each substrate processing apparatus. Here, as a method of evaluating the production quality of a substrate processing apparatus, there may be, for example, a method of evaluating the production quality by measuring a film formed on substrate by each substrate processing apparatus. However, such film formation measurement generally needs to be made using a dedicated measuring device. From such a viewpoint, if each substrate processing apparatus can evaluate the production quality thereof, the production qualities of substrate processing apparatuses can be simply and easily matched.

SUMMARY

Some embodiments of the present disclosure provide a substrate processing apparatus which is capable of evaluating a production quality thereof, a method of manufacturing a semiconductor device, and a program.

According to one aspect of the technique of the present disclosure, there is provided a technique that includes: a process chamber in which a substrate is processed; a memory that stores recipe information describing a procedure that executes the processing of the substrate, process data accumulated during the processing of a plurality of substrates, variation quality data calculated from the process data, and comparison data to be compared with the variation quality data; a monitor configured to monitor the process data; an analyzer configured to compare the variation quality data with the comparison data to obtain a reproduction index indicating a reproducibility of the comparison data, and calculate a correction value of setting information included in the recipe information when the reproduction index is smaller than a predetermined value; and a controller configured to be capable of correcting the setting information included in the recipe information with the correction value.

DETAILED DESCRIPTION

Hereinafter, some embodiments of the present disclosure will be described with reference to the drawings. Further, in the following, explanation for the present disclosure will be described schematically.

<Schematic Configuration of Substrate Processing Apparatus>

Figure 1:
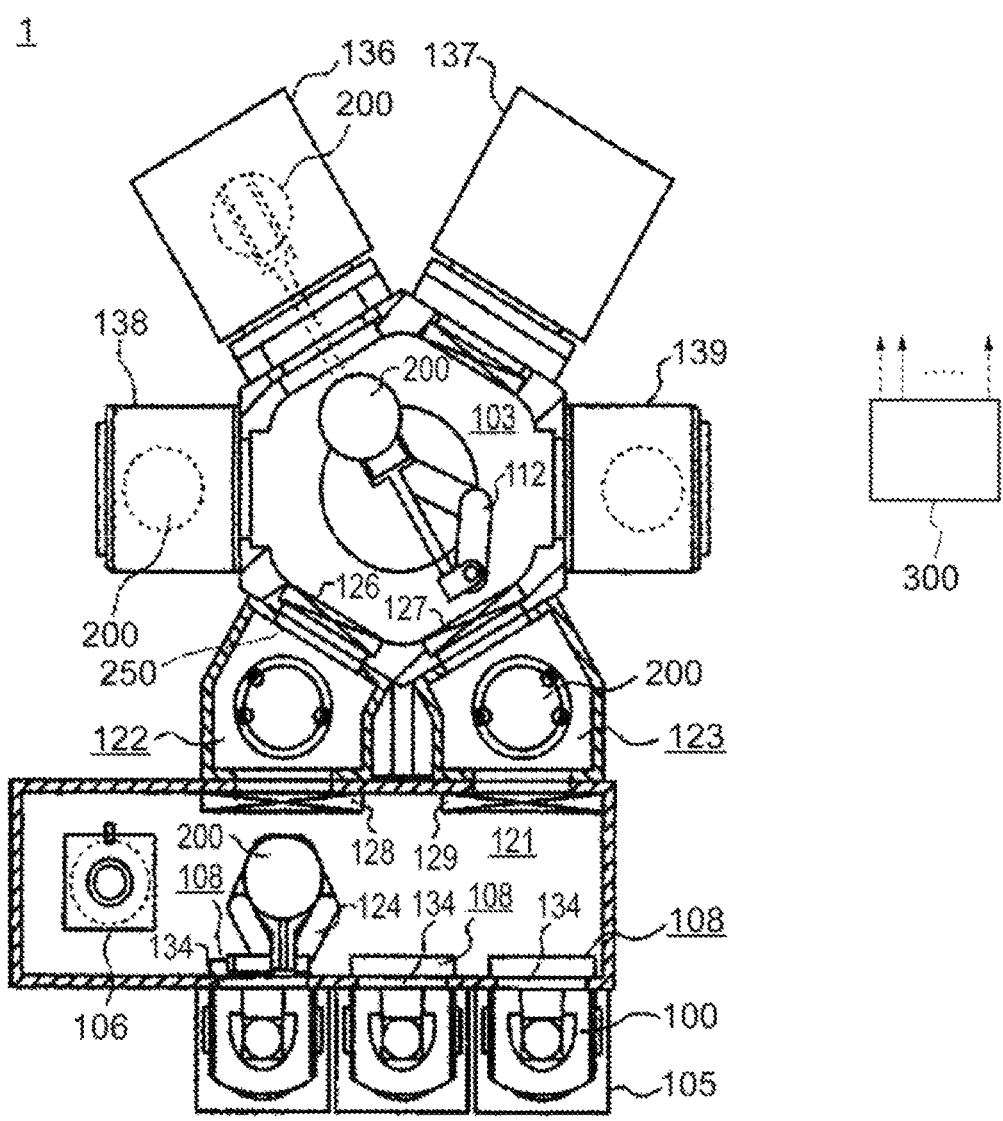
FIG. 1 is a schematic configuration view showing an example of a substrate processing apparatus according to an embodiment of the present disclosure.

FIG. 1 is a schematic configuration view showing an example of a substrate processing apparatus according to an embodiment of the present disclosure, more specifically a schematic cross-sectional view of the substrate processing apparatus as viewed from above. The substrate processing apparatus 1 according to the present embodiment may implement at least a portion of a method of manufacturing a semiconductor device. As shown in FIG. 1, the substrate processing apparatus 1 is a so-called cluster type substrate processing apparatus 1 and may be partitioned into a vacuum-side region (upper portion in FIG. 1) that operates in a negative pressure state lower than atmospheric pressure such as a vacuum state, and an atmospheric-side region (lower portion of FIG. 1) that operates in the atmospheric pressure. As the substrate processing apparatus 1 according to the present embodiment, an apparatus for performing a film-forming process on a substrate 200 in the method of manufacturing a semiconductor apparatus will be exemplified.

An atmospheric-side transfer chamber 121, two mounting chambers (load lock chambers) 122 and 123, an atmospheric-side transfer robot 124, a load port (10 stage) 105, and a notch alignment device 106 are provided in the atmospheric-side region. Of these, the atmospheric-side transfer chamber 121 may be a space in which the substrate 200 can be transferred in the atmospheric pressure. The atmospheric-side transfer robot 124 can be disposed inside the atmospheric-side transfer chamber 121. The two mounting chambers 122 and 123 are arranged at the boundary between the atmospheric-side region and the vacuum-side region and are spaces through which the substrate 200 is transferred between the two regions. Internal pressures of the two mounting chambers 122 and 123 may be changed according to an internal pressure of the atmospheric-side transfer chamber 121 and an internal pressure of a vacuum transfer chamber 103 to be described later. Thus, the two mounting chambers 122 and 123 may include a structure capable of withstanding a negative pressure environment. The two mounting chambers 122 and 123 and the atmospheric-side transfer chamber 121 are connected to each other via respective gate valves 128 and 129. The atmospheric-side transfer robot 124 may be a robot for transferring the substrate 200 before and after film formation in the atmospheric pressure.

The load port 105 is a stage disposed so as to be adjacent to the atmospheric-side transfer chamber 121. A plurality of storage containers, each of which is called a FOUP (Front Open Unified Pod) (hereinafter simply referred to as a "pod") 100, are placed on a stage of the load port 105. The pod 100 can store a plurality of substrates 200 therein and functions as a transfer carrier for the substrates 200. The plurality of pods 100 are placed on the load port 105 so that their openings match the respective substrate loading/unloading ports 134 provided in the atmospheric-side transfer chamber 121. Then, a lid provided in the opening of each pod 100 is opened/closed by a pod opener 108 that can open/close the substrate loading/unloading port 134, so that the substrates 200 can be taken in and out. The pod 100 is supplied to the load port 105 or discharged from the load port 105 by a transfer device (for example, an OHS (Over Head Shuttle) or an OHT (Overhead Hoist Transport)) (not shown). Further, the transfer of the pod by this transfer device may be managed by, for example, a host computer as an external computer to be described later. The notch alignment device 106 is a device for aligning the position of the substrate 200 by using a notch provided in the substrate 200. An orientation flat alignment device may be used instead of the notch alignment device 106.

The vacuum transfer chamber (transfer module) 103, a vacuum transfer robot 112, and a plurality of process chambers 136 to 139 may be mainly provided in the vacuum-side region. Of these, the vacuum transfer chamber 103 may be a space in which the substrate 200 can be transferred in a negative pressure. The vacuum transfer chamber 103 may be formed of a polygonal (hexagonal in FIG. 1) housing in a plan view. The two mounting chambers 122 and 123 are connected to two side surfaces of the polygonal housing via gate valves 126 and 127, respectively, and the plurality of process chambers 136 to 139 are connected to the other four side surfaces thereof. A gate valve that air-tightly shuts off spaces at the time of closing may also be interposed between the vacuum transfer chamber 103 and the process chambers 136 to 139, respectively. The shape of the vacuum transfer chamber 103 may be appropriately adjusted according to the number of mounting chambers and process chambers included in the substrate processing apparatus 1, the size of the substrate 200 to be handled, and the like.

The vacuum transfer robot 112 is disposed at substantially the central position of the vacuum transfer chamber 103 and may be any robot as long as it can transfer the substrate 200 between the mounting chambers 122 and 123 and the process chambers 136 to 139 or between the process chambers 136 to 139.

The plurality of (four in FIG. 1) process chambers 136 to 139 may be spaces in which one step in the method of manufacturing a semiconductor device, for example, a film-forming step, is executed. The specific structure of each of the process chambers 136 to 139 is not particularly limited, but for example, a substrate modifying process or a film-forming process may be adopted as processing contents in each of the process chambers 136 to 139. A batch type or single-wafer type processing method may be adopted as a processing method in each of the process chambers 136 to 139. Further, the processing contents in each of the process chambers 136 to 139 may be the same processing or different processing.

<Schematic Configuration of Control System>

Figure 2:
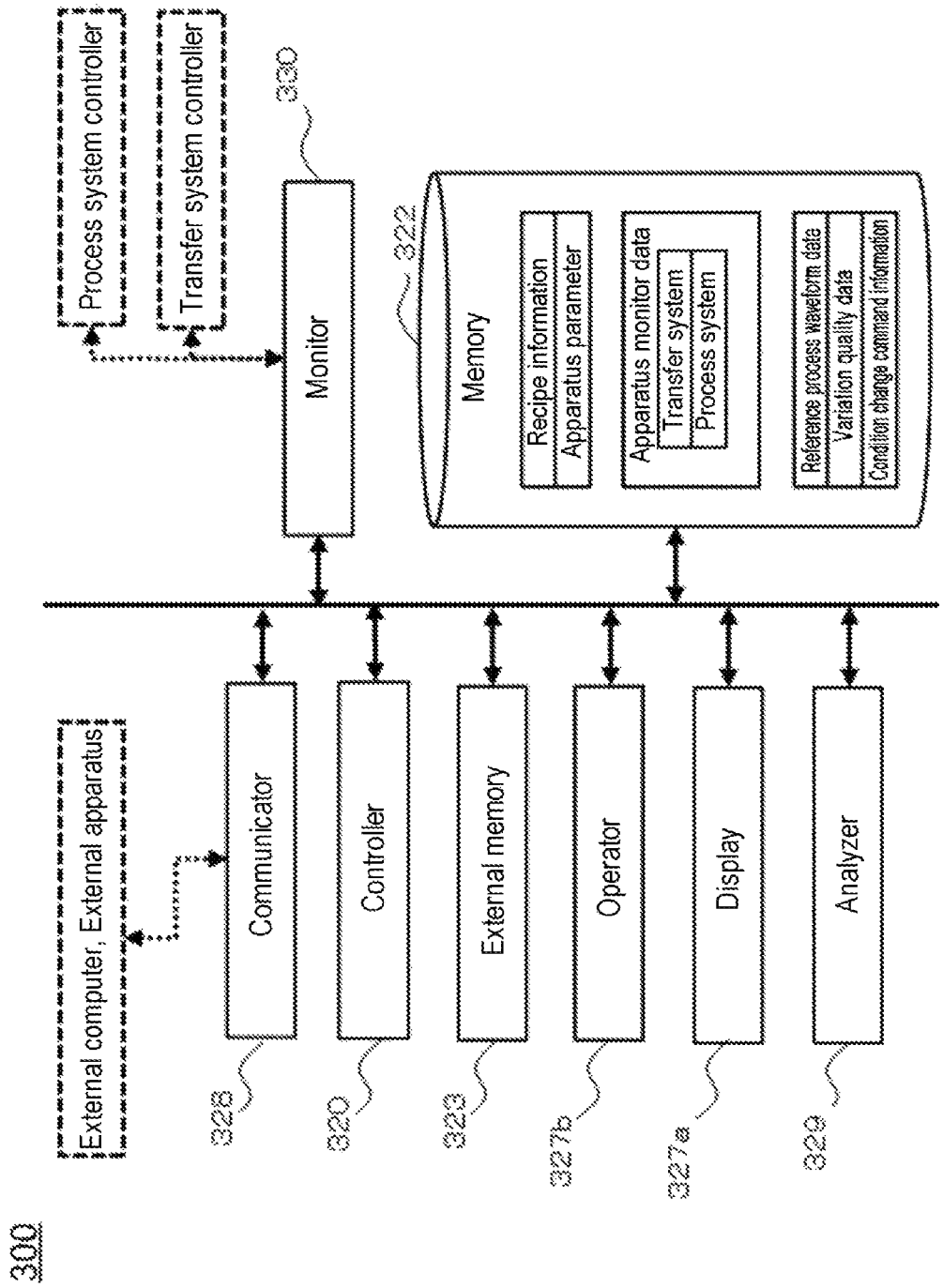
FIG. 2 is a functional block diagram showing an example of a control system that controls the substrate processing apparatus according to the embodiment of the present disclosure.

FIG. 2 is a functional block diagram showing an example of a control system that controls the substrate processing apparatus according 1 to the embodiment of the present disclosure. A series of control operations of the above-described substrate processing apparatus 1 may be controlled by a control system 300 that functions as a main controller. The control system 300 can be configured by, for example, a well-known computer. The well-known computer may include at least a volatile or nonvolatile memory (for example, a RAM (Random Access Memory) or a HDD (Hard Disk Drive)), and a processor represented by a CPU (Central Processing Unit). In the present embodiment, the control system 300 constitutes the main controller of the substrate processing apparatus 1, but the control system 300 may coexist with another main controller as a component different from the main controller.

As shown in FIG. 2, the control system 300 may include a controller 320 that can control the entire substrate processing apparatus 1 and correct recipe information to be described later, a memory 322 that accumulates and saves various information to be used in the control system 300, an external memory 323 that can transmit/receive data by being connected to an external storage medium such as a semiconductor memory, a display 327a that displays various information such as the status of substrate processing, an operator 327b that receives various instructions from an operator (specifically, an apparatus operator, an apparatus manager, an apparatus engineer, a maintenance worker, a worker, etc.), a communicator 328 that communicates with an external computer (for example, a host computer or data server as a higher-level computer for operating and monitoring a plurality of substrate processing apparatuses installed in a factory) and other apparatuses, an analyzer 329 that performs calculation of the variation quality data and reproduction index, which will be described later, and validation determination, and a monitor 330 that monitors process data from a transfer system controller and a process system controller. Here, the monitor 330 may request accumulation of monitoring results in the memory 322, or the memory 322 may store the monitoring results even if there is no request from the monitor 330.

The display 327*a* and the operator 327*b* may be configured by various user interfaces, particularly by a graphical user interface (GUI). The display 327*a* may display the editing status of apparatus data and recipe information, process data during substrate processing, the state of a transfer system, or related messages. The analyzer 329 may constitute a calculation device that is configured to generate the variation quality data and calculate the reproduction index. A method of generating the variation quality data and calculating the reproduction index will be described later.

The transfer system controller to which the monitor 330 is connected may be a controller for controlling members that transfer the substrate 200, such as the vacuum transfer robot 112 and the atmospheric-side transfer robot 124. The process system controller may be a controller for mainly controlling members used to process the substrate 200, such as the internal components of the process chambers 136 to 139, for example, a pump and a valve for vacuum-exhausting the interiors of the chambers, a valve for supplying a predetermined gas (for example, a process gas or an inert gas as a purge gas) into the chambers, and a heater for heating the substrate 200. Of course, these controllers may include various sensors (for example, a temperature sensor, a pressure sensor, and a gas flow rate sensor).

Information stored in the memory 322 mainly include recipe information describing the procedure for executing the processing of the substrate 200, apparatus parameters, process data monitored and accumulated by the monitor 330 during the processing of one or more substrates 200, variation quality data calculated from the process data, and comparison data for comparison with the variation quality data.

The process data is apparatus monitor data collected during recipe execution and may include raw waveform data detected by various sensors from the start to the end of recipe-based processing, and data of statistics (maximum value, minimum value, mean value, etc.) of each step in recipe. This process data may include transfer system process data acquired from the transfer system controller and process system process data acquired from the process system controller. Specifically, the process data in the present embodiment include waveform data of temperature, gas flow rate, and pressure at least during process execution in the process chambers 136 to 139, and these data are used for calculating the reproduction index to be described later.

The apparatus parameters may include data related to substrate processing, such as a processing temperature, a processing pressure, and a flow rate of a process gas when the substrate processing apparatus 1 processes the substrate 200, data related to the quality of manufactured product substrates (for example, the film thickness of a formed film and the cumulative value of the film thickness), or data related the components (a quartz reaction tube, a heater, a valve, a mass flow controller, etc.) of the substrate processing apparatus 1 (for example, their set value or measured value).

The variation quality data is data indicating a degree of variation in the quality of the substrate processing apparatus 1 with respect to the standard quality and may be obtained by calculation. The process data monitored by the monitor 330 and stored in the memory 322 and reference process data as a comparison source are used in calculating the variation quality data. Here, the reference process data may be process data obtained when the substrate is processed with the quality of a predetermined level or higher. Further, the reference process data is process data extracted from an apparatus to be compared (for example, an apparatus with the highest quality) or from an experiment conducted in advance and may be composed of process data accumulated during processing of one substrate 200. For example, an apparatus having good quality data first or a reference apparatus (master apparatus) first delivered to a factory or the like may be adopted as the apparatus to be compared. The data extracted from an experiment or the like may be, for example, the best data extracted through various experiments. A specific method of calculating the variation quality data will be described later.

The comparison data is data to be compared with the above-mentioned variation quality data and may be composed of variation quality data calculated by using the data extracted from the apparatus to be compared (for example, the apparatus with the highest quality) or the data extracted from the experiment conducted in advance. The comparison data and the above-mentioned reference process data are stored in the memory 322 in advance before determining the validity of the reproduction index, and the like, but may be acquired via a network if the apparatus having the respective data is connected by the network and may also be copied into the memory 322 via the external memory 323 by using an external storage medium. In the present embodiment illustrated below, an example is shown in which the comparison data is acquired from the apparatus to be compared, via the network, and the above-mentioned reference process data is the data acquired from the experiment or the like conducted in advance, which is acquired via the external memory 323 or via the communicator 328 from an external computer or the like connected via the network, and stored in the memory 322.

Figure 3:
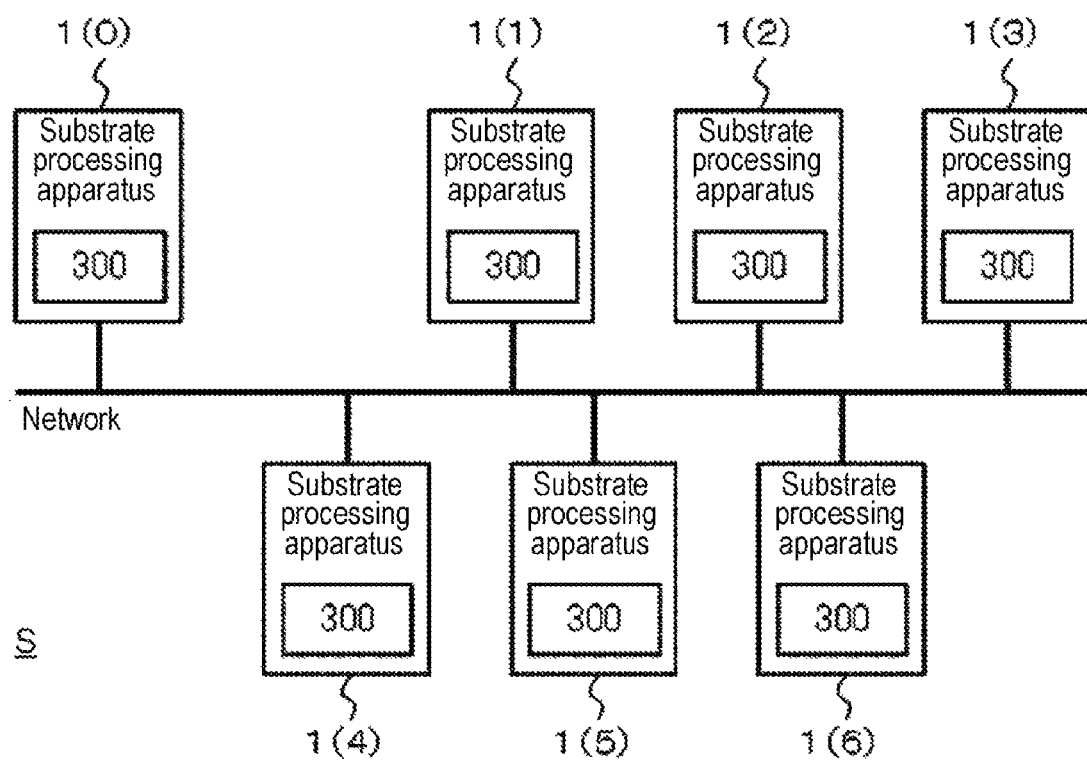
FIG. 3 is a schematic diagram showing an aspect of a substrate processing system including the substrate processing apparatus according to the embodiment of the present disclosure.

FIG. 3 is a schematic diagram showing an aspect of a substrate processing system including the substrate processing apparatus 1 according to the embodiment of the present disclosure. A substrate processing system S, which is installed in a factory or the like, may include a plurality of substrate processing apparatuses 1 according to the present embodiment, for example, as shown in FIG. 3, seven substrate processing apparatuses 1(0) to 1(6) which are connected to each other via a network so as to exchange data therebetween. Further, the plurality of substrate processing apparatuses 1(0) to 1(6) may include a common hardware configuration so that a common processing process can be carried out. Among the substrate processing apparatuses in the substrate processing system S shown in FIG. 3, one substrate processing apparatus, for example, the substrate processing apparatus 1(0), is a master apparatus which has the standard apparatus data and is first delivered to a factory or the like. In addition, the other substrate processing apparatuses, that is, the other six substrate processing apparatuses 1(1) to 1(6), are, for example, apparatuses delivered to the factory or the like after the master apparatus. These six substrate processing apparatuses 1(1) to 1(6) are process apparatuses that realize the same process as the master apparatus by receiving various information possessed by the master apparatus directly from the master apparatus or via the network from an external computer (not shown) connected to the network. In the following description, the substrate processing apparatus 1 according to the present embodiment will be described as corresponding to one process apparatus (for example, the substrate processing apparatus 1(1)) among the plurality of substrate processing apparatuses. In some embodiments, the substrate processing apparatus 1 according to the present embodiment may correspond to the master apparatus. In that case, the data or the like extracted from the experiment or the like may be adopted as the comparison data.

In the substrate processing apparatus 1 constituting the above-mentioned process apparatus, the variation quality data calculated in the process chamber of the master apparatus that has executed the same process as the process executed in the process chamber of the substrate processing apparatus 1 may be adopted as the above-mentioned comparison data. In this way, by adopting the variation quality data of the process chamber of the master apparatus as the comparison data, it is possible to evaluate the reproducibility of the process of the master apparatus in the process chamber of the process apparatus. In addition, by comparing the variation quality data calculated by the process apparatus with the variation quality data calculated by the master apparatus, it is possible to match the production qualities of both apparatuses. As a result, it is possible to match the qualities of product substrates manufactured in a factory, thereby improving the manufacturing yield.

<Method of Manufacturing Semiconductor Devices>

Prior to description on a method of generating the variation quality data, an example of the method of manufacturing a semiconductor device carried out by the substrate processing apparatus 1 according to the present embodiment will be described. The semiconductor device manufacturing method (substrate processing method) referred to here will be described below assuming that it refers to a substrate film-forming process that constitutes a part thereof. The method of manufacturing the semiconductor device by using the substrate processing apparatus 1 according to the present embodiment is not limited to the substrate film-forming process, but may be other processes.

First, in order to carry out the above-mentioned semiconductor device manufacturing method, recipe information (process recipe) including desired substrate processing contents is deployed in a memory such as a RAM (not shown) in the process system controller. Then, the control system 300 may give an operation instruction to the process system controller or the transfer system controller. The semiconductor device manufacturing method carried out in this manner may include at least a loading step, a film-forming step, and an unloading step.

First, the control system 300 issues a drive instruction to the transfer system controller so as to drive the atmospheric-side transfer robot 124 and the like to start the loading step. Then, the atmospheric-side transfer robot 124 starts a process of transferring the substrate 200 in the pod 100 to the mounting chambers 122 and 123. When the substrate 200 is mounted on the mounting chambers 122 and 123, the interior of the mounting chambers 122 and 123 is adjusted to be of the same negative pressure as the vacuum transfer chamber 103, and then the substrate 200 is loaded into a desired process chamber (for example, the process chamber 136) by the vacuum transfer robot 112.

When the substrate 200 is loaded into the process chamber 136, the control system 300 issues to the process system controller a drive instruction based on the recipe information, a loading path of the substrate 200 is blocked to keep the process chamber 136 airtight, and then, the film-forming step according to the above recipe information is started. In the film-forming step, for example, first, the interior of the process chamber 136 is vacuum-exhausted so as to be of a predetermined film-forming pressure (vacuum degree). Then, the interior of the process chamber 136 is heated by the heater so as to be at a predetermined temperature. Subsequently, while maintaining the interior of the process chamber 136 at the predetermined pressure and the predetermined temperature, a predetermined gas (process gas) is supplied to the surface of the substrate 200 while rotating the substrate 200 to form a film on the substrate 200. Further, an adjustment such as lowering the internal temperature of the process chamber 136 from the processing temperature or stopping the rotation of the substrate 200 may be performed before a subsequent unloading step.

When the film-forming step is completed, the control system 300 issues to the transfer system controller a drive instruction to the vacuum transfer robot 112 or the like to start the unloading step. In the unloading step, the processed substrate 200 in the process chamber 136 is unloaded to the vacuum transfer chamber 103. The unloaded processed substrate 200 is cooled and then returned and transferred to the pod 100 via the mounting chambers 122 and 123 and the atmospheric-side transfer robot 124.

Here, in the film-forming step, the process data is monitored by the monitor 330 in parallel with the film-forming step, and the obtained data is sequentially stored in the memory 322. Then, the variation quality data is generated (calculated) by using this process data. Further, the reproduction index is obtained by comparing this variation quality data with the comparison data stored in the memory 322. When the reproduction index is less than a desired value, a correction value of setting information included in the executed recipe information is calculated, and a correction is performed based on the calculated correction value. Therefore, each of steps of generating the variation quality data, calculating the reproduction index, determining the validation of the reproduction index, and correcting the setting information in the recipe information will be described in detail below.

<Method of Generating Variation Quality Data>

Figure 4:
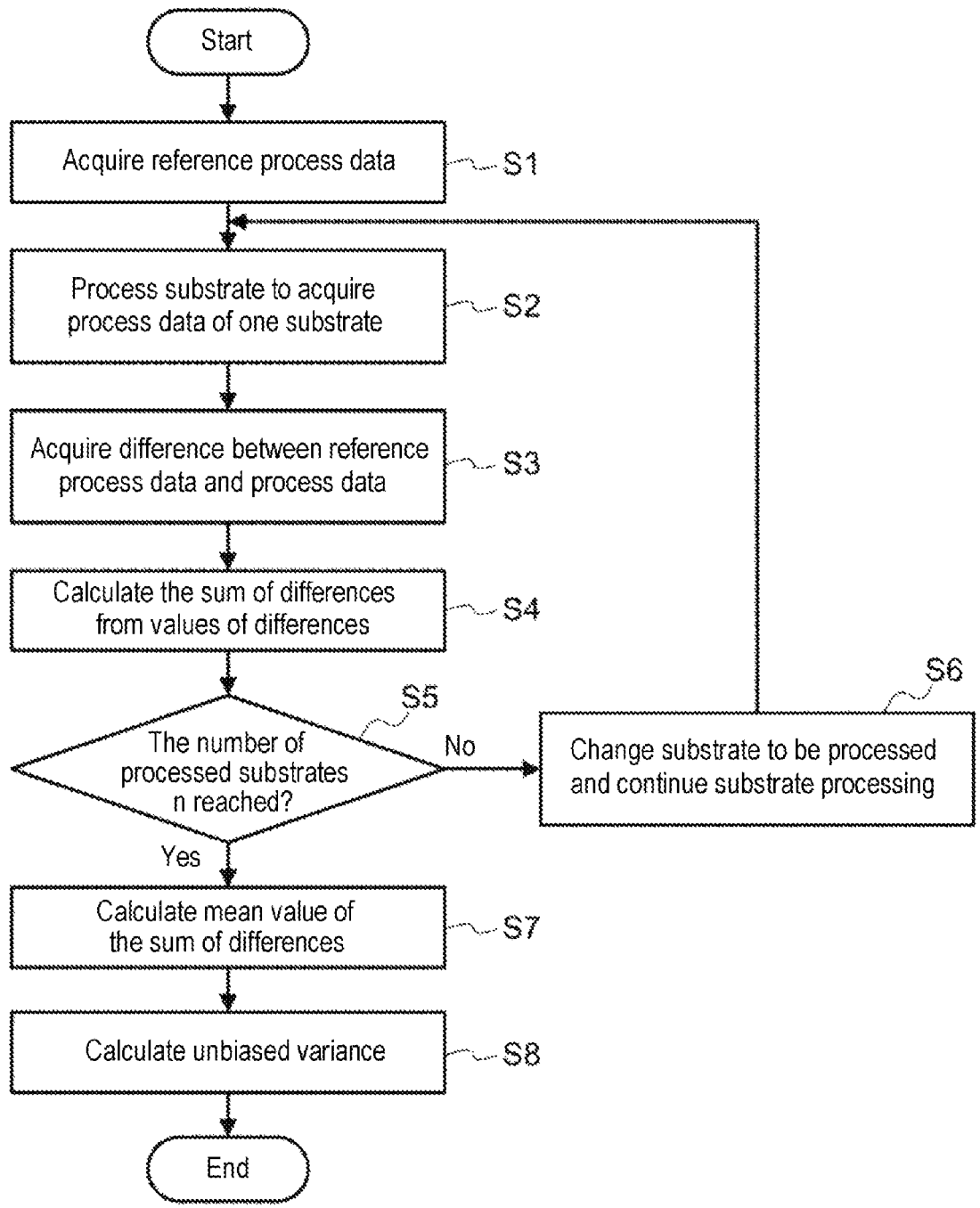
FIG. 4 is a flowchart showing an example of a method of generating variation quality data in the substrate processing apparatus according to the embodiment of the present disclosure.

FIG. 4 is a flowchart showing an example of the method of generating the variation quality data in the substrate processing apparatus 1 according to the embodiment of the present disclosure. In the substrate processing apparatus 1 as one process apparatus, the generation of the variation quality data may be started, for example, at the timing when the substrate processing apparatus 1 is powered on, or at the timing when the substrate 200 is loaded into an arbitrary process chamber and mounted on a susceptor or a boat in the process chamber, and a process operation, for example, the film-forming step can be started. In the following description, an example will be described in which a single-wafer process chamber capable of performing a predetermined film-forming process on the substrate 200 is used as the process chamber for processing the substrate. Further, since the specific components and the like in the process chamber may be well known, detailed description thereof will be omitted. Further, in the following description, the example has been described in which the variation quality data is generated based on the data from the process system controller, which is acquired during the substrate processing executed in the process chamber, but the present disclosure is not limited thereto. Specifically, the variation quality data may be generated based on data from the transfer system controller and may be appropriately adjusted according to a data generation target.

When the generation of the variation quality data is started, the control system 300 first acquires reference process data $y_1$ via the communicator 328 (51). The reference process data $y_1$ may be composed of, for example, waveform data used to execute an ideal processing process owned by an external computer. Specifically, the waveform data may be composed of at least one selected from the group of waveform data related to a temperature change, waveform data related to a pressure change, and waveform data related to a gas flow rate (including inflow rate and outflow rate) during processing process execution. In the following description, a case where the reference process data $y_1$ is composed of the waveform data related to the temperature change of the substrate (or the interior of the process chamber) will be illustrated.

After the reference process data $y_1$ is acquired, in the substrate processing apparatus 1, a film-forming process on one substrate 200 loaded into the process chamber according to the recipe information is started in order to generate the variation quality data. Along with this, the monitor 330 operates to start monitoring the process data in the process. Then, when the film-forming process on the one substrate 200 is completed in the substrate processing apparatus 1, waveform data (hereinafter also referred to as "process waveform data") $y_2$ as the process data related to the processing of the one substrate 200 is acquired (S2). The process data $y_2$ acquired here may be composed of the same waveform data as the reference process data $y_1$ acquired in advance, for example, the waveform data of the temperature change of the substrate. Then, by comparing the acquired process data $y_2$ with the reference process data $y_1$ acquired in advance, a difference between both is acquired (S3).

Figure 5:
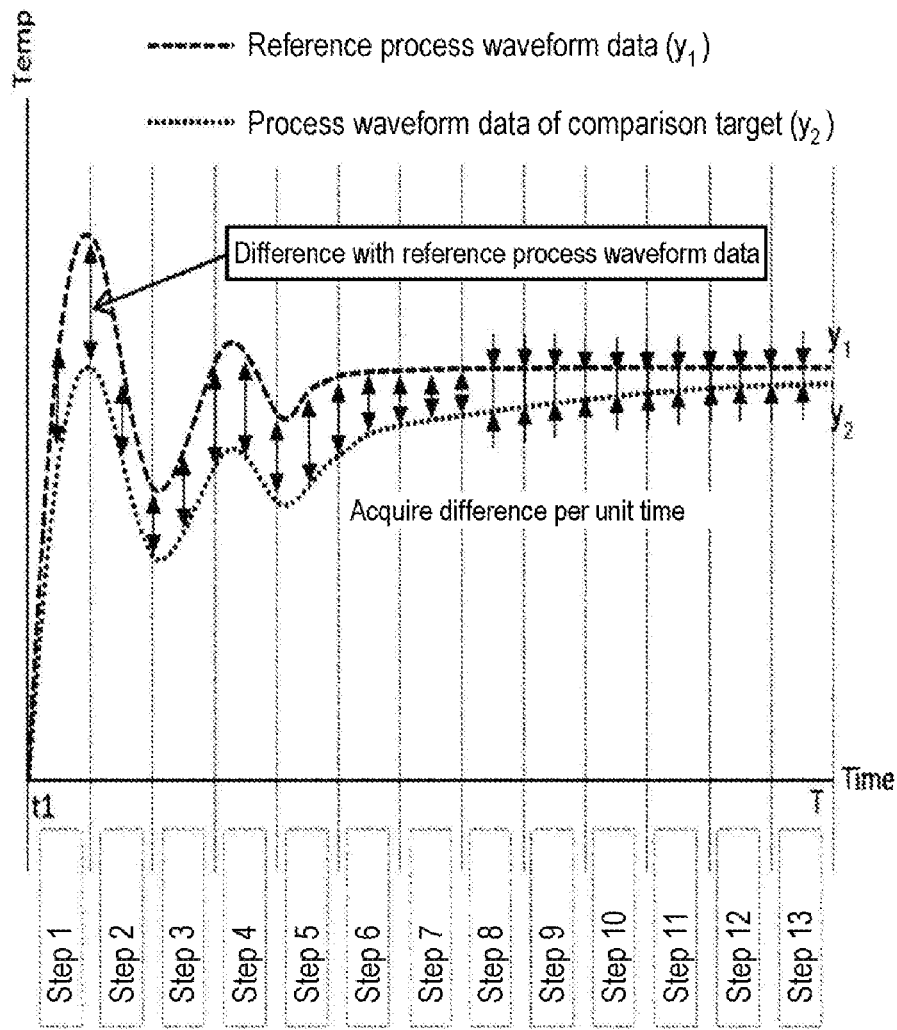
FIG. 5 is a diagram showing an example of a temperature change between reference process data and process data to be compared with the reference process data when a series of substrate processing is executed.

FIG. 5 is a diagram showing an example of the temperature change between the reference process data $y_1$ and the process data $y_2$ to be compared with the reference process data when a series of substrate processing is executed. As shown in FIG. 5, there is a difference in the temperature change between the reference process data $y_1$ and the process data $y_2$ actually measured by the monitor 330. This difference in the temperature change tends to be remarkable due to the occurrence of mechanical abnormalities in the substrate processing apparatus 1, time-dependent deterioration, and the like. Therefore, the difference in the temperature change is acquired as a data difference at a predetermined time interval t (for example, 1 second interval). The values of differences acquired here are then added up to calculate the sum of differences (S4). The calculation of the sum $x_1$ of differences may be implemented by using the following formula.

$$x_1 = \sum_{t=1}^{T} (y_1 t - y_2 t) \qquad \text{[Formula 1]}$$

Here, it is preferable that the calculation of the sum of differences is performed in step units of the substrate processing apparatus 1. The step used here refers to a portion of a process in which different setting values may be set in the recipe information. Specifically, the step used here may include a heating step of heating the process chamber, a film-forming step of forming a film on the substrate, a $N_2$ purging step of purging the process chamber with a $N_2$ (nitrogen) gas as an inert gas, a cooling step of cooling the processed substrate, a loading/unloading step of loading/unloading the substrate into/from the process chamber, an APC valve ON/OFF step of turning on/off an APC (Auto Pressure Controller) valve for adjusting the internal pressure of the process chamber, and an evacuating step of evacuating the interior of the process chamber. The calculation of the sum of differences is executed one or more times for the steps included in the recipe information. By extracting the sum of differences in step units in this way, it is possible to reflect the correction value, which will be described later, in step units. As a result, since fine adjustment of the setting information may be implemented, the reproducibility may be easily improved.

The sum of differences calculated here is temporarily stored in the memory 322. Then, it is determined whether or not the number of processed substrates has been reached a preset number of processed substrates for calculating the variation quality data (also referred to as "Run number") n (S5). When it is determined that the number of processed substrates has not yet reached the preset number n ("No" in S5), the substrate as a target to be processed is changed, and then the substrate processing is continued (S6). While the substrate processing is continued, the acquisition of the process data $y_2$ (S2) and the calculation of the difference and the sum of differences (S3 and S4) by the monitor 330 are continuously executed. The value of the number of processed substrates n is not particularly limited, but it is preferably set to plural sheets. By setting the number of processed substrates n to plural sheets, it is possible to calculate the variation quality data using a plurality of process data, so that the substrate processing capacity of the substrate processing apparatus 1 may be grasped more accurately.

When the substrate processing is continued until the preset number n is reached ("Yes" in S5), the process data and the value of the sum of differences related thereto are also accumulated in the memory 322 for the number of substrates n. Therefore, subsequently, the mean value $\bar{x}$ of the values of the sum of differences $(x_1, x_2, x_3, \ldots, x_n)$ of the accumulated number of substrates n is calculated (S7). The calculation of the mean value may be implemented by using the following formula.

$$\bar{x} = \frac{x_1 + x_2 + x_3 + \ldots + x_n}{n} \qquad \text{[Formula 2]}$$

After the mean value is calculated, subsequently, an unbiased variance $s_2$ is calculated (S8). The calculation of the unbiased variance may be implemented by using the following formula.

$$s^2 = \frac{1}{n-1} \sum_{i=1}^{n} (x_i - \bar{x})^2 \qquad \text{[Formula 3]}$$

Both the mean value and the unbiased variance value calculated here may be calculated in step units in the same manner as the calculation of the sum of differences.

Then, the mean value $\bar{x}$ and the unbiased variance s2 calculated by the above steps are stored in the memory 322 as the variation quality data (for each step) in Run number n of one process chamber of the substrate processing apparatus 1. This completes the generation of the variation quality data in one process chamber of the substrate processing apparatus 1. In the above-described method of calculating the variation quality data, the case where the process data is composed of the waveform data of the temperature change has been described, but separately from or in parallel with this, it is possible to calculate the variation quality data by using other process data, for example, the waveform data of the gas flow rate and the waveform data of the pressure change. Then, it is preferable to calculate a plurality of variation quality data in one process chamber of the substrate processing apparatus 1 because a plurality of reproduction indexes, which will be described later, may be calculated based on different data. Since a method of calculating the variation quality data by using the other process data is almost the same as that described above, the description thereof is omitted here in order to avoid duplication.

Figure 6:
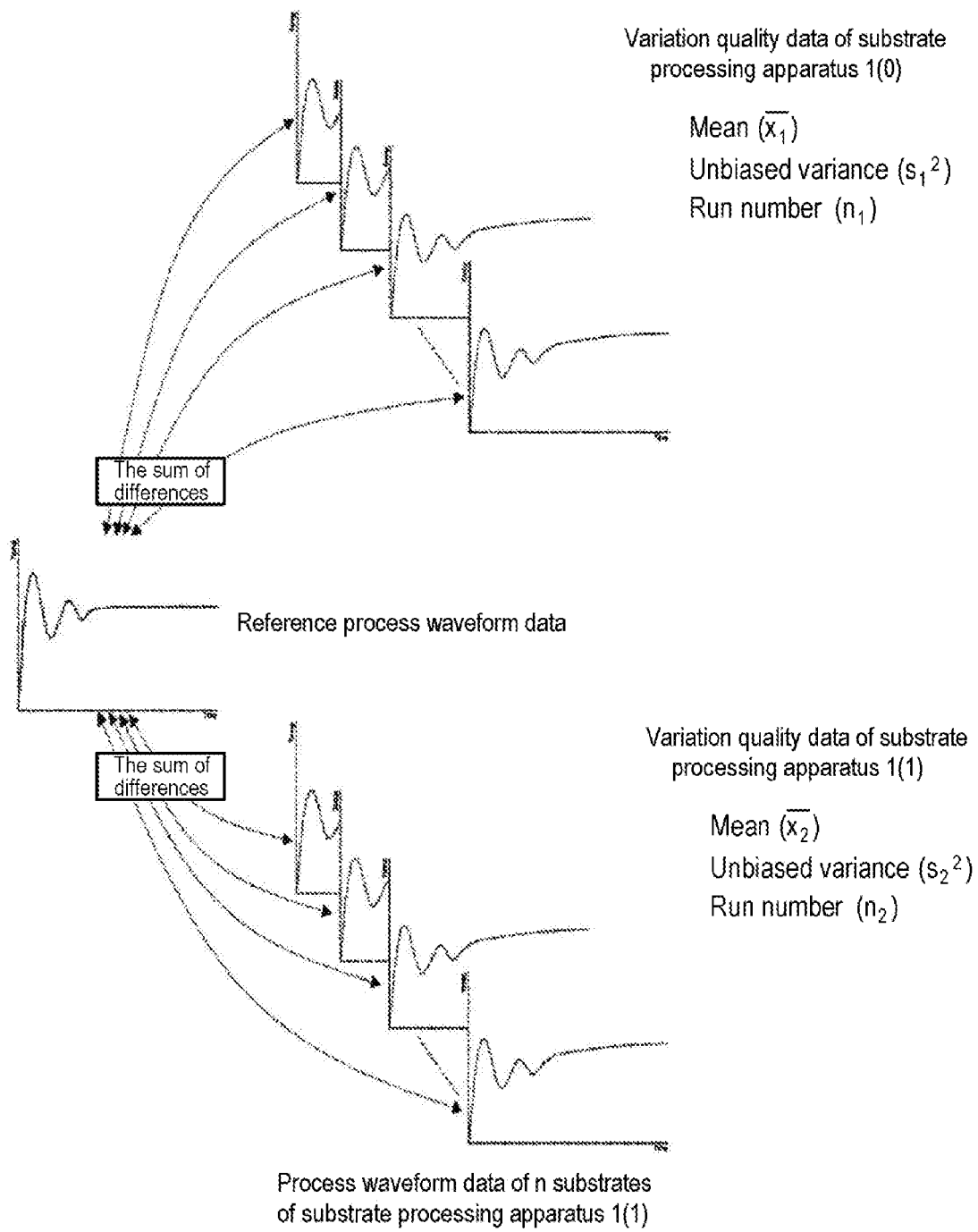
FIG. 6 is a diagram schematically showing the method of generating variation quality data shown in FIG. 4.

FIG. 6 is a diagram schematically showing the method of generating the variation quality data shown in FIG. 4. As shown in FIG. 6, the above-described series of variation quality data generation method is performed in one process chamber (for example, the process chamber 136) of the substrate processing apparatus 1 (for example, the substrate processing apparatus 1(1)) according to the present embodiment, but may be performed in other process chambers as well. The other process chambers may include other process chambers that perform the common process in the substrate processing apparatus 1, and process chambers that perform the same process as the above-mentioned one process chamber, among the process chambers in the other substrate processing apparatuses 1(0) and 1(2) to 1(6) that constitute the master apparatus or another remote apparatus. Here, as described above, in the present embodiment, since the variation quality data of the process chamber of the substrate processing apparatus 1(0) constituting the master apparatus is adopted as the comparison data, the calculation of the variation quality data may be performed in advance in one process chamber of the substrate processing apparatus 1(0).

<Method of Calculating Reproduction Index>

Following the above, a method of calculating the reproduction index in the substrate processing apparatus 1 according to the present embodiment and a method of determining the validation of the process in the substrate processing apparatus 1 using the calculated reproduction index will be described below. The reproduction index may be an index indicating how accurately the substrate processing executed by the substrate processing apparatus 1 can reproduce the desired substrate processing to be compared. By using this reproduction index, it is possible to quantitatively express a difference in the process between apparatuses or process chambers, so that the reproduction may be easily recognized. In the present embodiment, a value representing the degree of reproduction when the substrate processing performed by the master apparatus is reproduced by the substrate processing apparatus 1 corresponds to the reproduction index. Steps shown below may be mainly performed by the analyzer 329 of the substrate processing apparatus 1.

Figure 7:
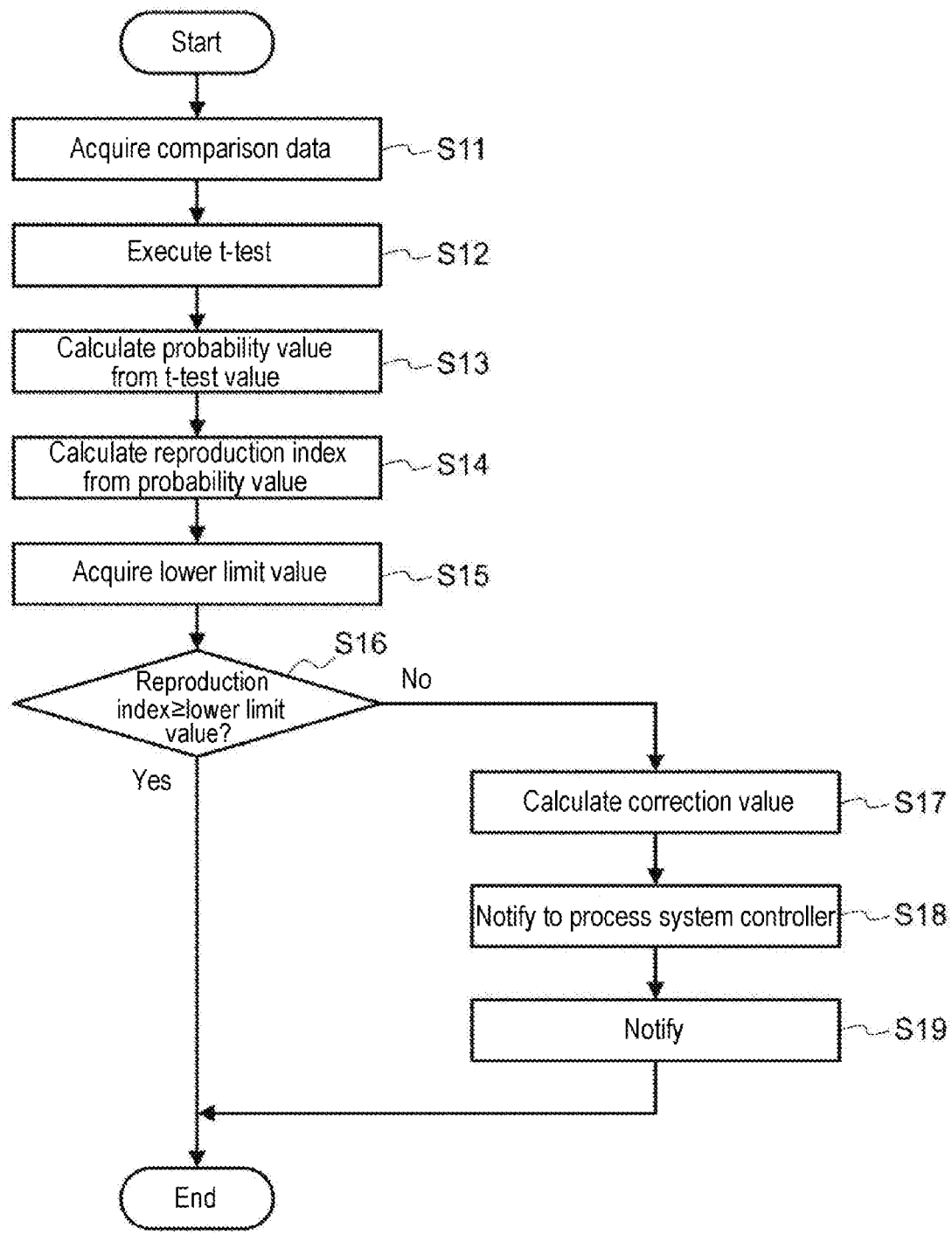
FIG. 7 is a flowchart showing an example of a method of calculating a reproduction index in the substrate processing apparatus according to the embodiment of the present disclosure.

FIG. 7 is a flowchart showing an example of the method of calculating the reproduction index in the substrate processing apparatus according to the embodiment of the present disclosure. When the reproduction index is calculated in the substrate processing apparatus according to the present embodiment, first, the variation quality data of the substrate processing apparatus 1(0) as the master apparatus is acquired as the comparison data (S11). The variation quality data of the substrate processing apparatus 1(0) as the master apparatus may be acquired via a network using, for example, the communicator 328. The data acquired here is stored in the memory 322. The comparison data acquired here and the variation quality data generated in the substrate processing apparatus 1 are both generated in step units. Therefore, the reproduction index calculated based on these data is also specified in step units.

After the comparison data is stored, a t-test is executed in order to specify the reproduction index from the comparison data and the variation quality data of the substrate processing apparatus 1 calculated in advance (S12). This t-test may be implemented by using the following formula.

$$t = \frac{\bar{x}_1 - \bar{x}_2}{\sqrt{s^2\left(\frac{1}{n_1} + \frac{1}{n_2}\right)}} = \frac{\bar{x}_1 - \bar{x}_2}{s\sqrt{\frac{1}{n_1} + \frac{1}{n_2}}} \qquad [\text{Formula 4}]$$

$$s^2 = \frac{(n_1 - 1) \times s_1^2 + (n_2 - 1) \times s_2^2}{n_1 - n_2 - 2} \qquad [\text{Formula 5}]$$

Here, t is a t-test value, $\bar{x}_1$ is the mean value of the sum of differences as the comparison data, $n_1$ is Run number as the comparison data, $s_1^2$ is the unbiased variance as the comparison data, $\bar{x}_2$ is the mean value of the sum of differences as the variation quality data (of this substrate processing apparatus 1), $n_2$ is Run number as the variation quality data, $s_2^2$ is the unbiased variance as the variation quality data, and $s_2$ is a pooled variance (an integration of unbiased variances of two samples into one unbiased variance).

When the t-test value is specified by the above formulas, then a probability value (p-Value) p is calculated from the t-test value (S13). The calculation of the probability value p may be obtained from, for example, a t distribution table represented by t-test values.

When the probability value p is calculated, then the reproduction index is calculated by using the probability value p (S14). This reproduction index may be expressed by reproduction index=(1−p)×100. In the above-mentioned t-test, when s is 0, t cannot be calculated. Therefore, in this case, p=0 and the reproduction index is 100.

Figure 8:
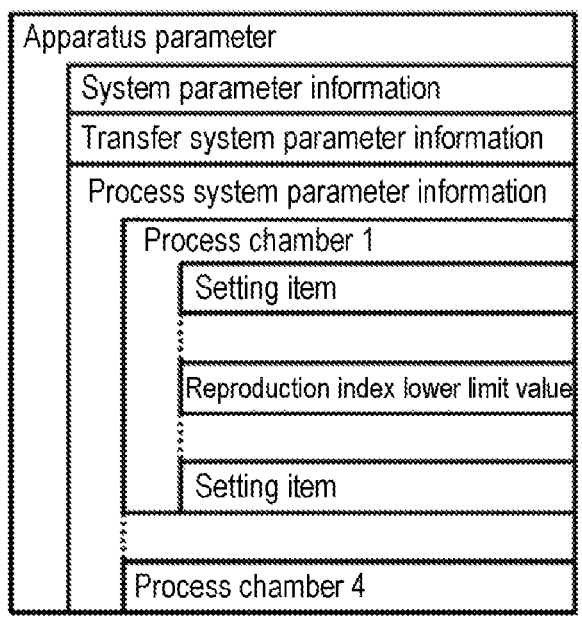
FIG. 8 is a diagram showing an example of an apparatus parameter table stored in a memory of the substrate processing apparatus according to the embodiment of the present disclosure.

FIG. 8 is a diagram showing an example of an apparatus parameter table stored in the memory of the substrate processing apparatus according to the embodiment of the present disclosure. When the reproduction index is calculated in the above step, the analyzer 329 acquires a lower limit value for determining the validation of the reproduction index (S15). As shown in FIG. 8, the lower limit value may be stored in an appropriate place in the apparatus parameter table constituting the apparatus parameters stored in the memory 322. Further, the lower limit value is a value predetermined by an administrator or the like and functions as a threshold value of the reproduction index.

Next, the validation of the reproduction index is determined by comparing the acquired lower limit value with the calculated reproduction index (S16). Specifically, it is determined whether or not the value of the reproduction index is larger than the lower limit value. When the reproducibility index is equal to or larger than the lower limit value ("Yes" in S16), it is determined that the reproducibility of the substrate processing by the substrate processing apparatus 1 (relative to the process in the master apparatus) is high, and the process is performed normally. Then, the process shown in FIG. 7 ends.

In contrast, when the reproduction index is smaller than the lower limit value ("No" in S16), it is determined that the reproducibility of the substrate processing by the substrate processing apparatus 1 is low, admitting that an abnormality occurs in the process. In this case, the analyzer 329 calculates a correction value for correcting the setting information included in the recipe information (S17). In the calculation method of this correction value, in addition to the value of the reproduction index, the type of process data used when calculating the reproduction index and equipment in the corresponding process chamber are taken into consideration and may be set to be calculated automatically. Specific examples thereof will be given later. When the reproduction index is calculated based on the process data related to the temperature change and it is determined that the reproduction index is below the lower limit value, the analyzer 329 may be set in advance so as to automatically calculate a correction value for raising or lowering a target temperature at an arbitrary time point of the heater operating in the corresponding step in the corresponding process chamber. In this way, by automatically recognizing and calculating the target process type, the target step, the current set value, and the correction value, it is possible to shorten the time required for adjusting the apparatus. It should be noted that the analyzer 329 may determine the specific correction value in a non-automated manner. For example, at the point of time when it is detected that the reproduction index is smaller than the lower limit value, an arbitrary operator may be notified of that fact, and the correction value may be specified by requesting an input of the correction value via the operator 327b. At this time, various information for specifying the correction value may be displayed on the display 327a.

Figure 9:
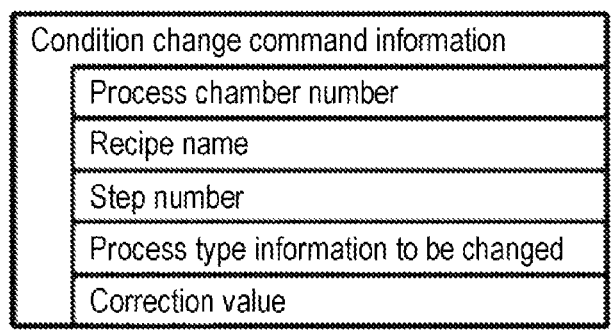
FIG. 9 is a diagram showing an example of a condition change command information table for correcting setting information included in recipe information.

FIG. 9 is a diagram showing an example of a condition change command information table for correcting the setting information included in the recipe information. When the correction value is calculated by the analyzer 329, the controller 320 corrects the setting information included in the recipe information by notifying the process system controller of the correction value (S18). At the time of this correction, it is preferable to use a condition change command information table shown in FIG. 9. As shown in FIG. 9, the condition change command information table includes at least a process chamber number to be corrected, a recipe name, a step number, process type information to be changed, and a specific correction value so as to implement an appropriate correction on the side of the process system controller. Further, the condition change command information table may be stored in the memory 322.

When the setting information included in the recipe information is corrected, the substrate processing apparatus 1 notifies that fact (S19) and ends the process shown in FIG. 7. As a method of the notification, various methods may be adopted. For example, a method of displaying a message related to the correction contents or the like on the display 327a of the control system 300 or a method of notifying an operator or the like that the correction has been performed or an abnormality has been detected by using voice or visual effects may be adopted. In addition, a method of transmitting a message including information such as the fact that an abnormality has occurred, the fact that the correction has been made, or the correction result of the recipe information to an external computer via the communicator 328, and displaying the message on the external computer, for example, a host computer, so as to notify an administrator or the like of the fact of the correction may be adopted. Further, in FIG. 7, an example of giving a notification to the operator or the like after the correction is performed is illustrated, but the notification may be given at the timing before the correction is performed, for example, at the timing when it is detected than the calculated reproduction index is below the lower limit value ("No" in S16).

It is preferable to calculate a plurality of above-mentioned reproduction indexes by using the variation quality data and the comparison data generated based on the process data of different types (for example, three types of temperature monitor data, gas flow rate monitor data, and pressure monitor data). By performing validation determination for each of the plurality of reproduction indexes calculated for a single process chamber, the reproducibility of the substrate processing by the substrate processing apparatus 1 may be evaluated from various perspectives.

Further, as described above, since the variation quality data and the comparison data are calculated in step units, the reproduction index is also calculated in step units. Therefore, when the reproduction index smaller than the lower limit value is detected, an object requiring the correction may be limited to a corresponding one step. Therefore, it is possible to make fine adjustment and specify a correction value relatively easily.

Further, the above-described series of semiconductor device manufacturing method may be executed by a processor by executing a program that may be stored in a memory of a computer, for example, a computer or a host computer constituting the control system 300. In addition, this program may be provided in the format of an application offered by a server device placed on a network or by a cloud-based data processing platform, or may be provided in the form of a non-transitory computer-readable recording medium that stores the program.

As described above, with the substrate processing apparatus, the semiconductor device manufacturing method, and the recording medium according to the present embodiment, it is possible to evaluate the production quality of processing by the substrate processing apparatus without using additional measuring devices or the like. As a result, it is possible to easily implement the matching of production quality with other substrate processing apparatuses. Further, by making the validation determination of the reproduction index, it is possible to detect a decrease in the reproducibility of a process, and hence it is possible to detect or predict an abnormality. Furthermore, when it is detected that the reproduction index is smaller than a preset value, it is possible to specify the optimal correction value from a series of determination processes, in addition to the process type and set value that need to be corrected. Therefore, it is possible to shorten the adjustment time when an abnormality occurs.

In addition, the above correction may correspond to correction in maintenance accompanying time-dependent deterioration of the apparatus. Further, by using the correction for adjustment of process apparatuses that operate under the same conditions as the master apparatus, the adjustment becomes easy and contributes to the start of early production.

PREFERABLE ASPECTS OF PRESENT DISCLOSURE

Hereinafter, some preferable aspects of the present disclosure will be additionally described as supplementary notes.

(Supplementary Note 1)

According to one aspect of the present disclosure, there is provided a substrate processing apparatus including:

a process chamber in which a substrate is processed;

a memory that stores recipe information describing a procedure for executing the processing of the substrate, process data accumulated during the processing of a plurality of substrates, variation quality data calculated from the process data, and comparison data to be compared with the variation quality data;

a monitor configured to monitor the process data and request the memory to store the process data;

an analyzer configured to compare the variation quality data with the comparison data to obtain a reproduction index indicating the reproducibility of the comparison data, and calculate a correction value of setting information included in the recipe information when the reproduction index is smaller than a predetermined value; and a controller configured to be capable of correcting the setting information included in the recipe information with the correction value.

(Supplementary Note 2)

The substrate processing apparatus of Supplementary Note 1, further including: a communicator configured to communicate with an external computer or other external apparatuses, wherein the comparison data is received from the external computer or the other external apparatuses via the communicator and is stored in the memory.

(Supplementary Note 3)

The substrate processing apparatus of Supplementary Note 1, wherein the variation quality data is data obtained by obtaining the sum of differences per unit time from process data accumulated during the processing of one substrate and reference process data, and obtaining a mean value and an unbiased variance from the sum of differences for a plurality of substrates obtained by performing the processing on the plurality of substrates one or more times, wherein the reference process data is process data acquired from an apparatus that processes a substrate with the quality of a predetermined level or higher, wherein the mean value is a result of dividing the sum of differences by the number of processed substrates, and wherein the unbiased variance is a result calculated from the sum of differences and the mean value for the number of processed substrates.

(Supplementary Note 4)

The substrate processing apparatus of Supplementary Note 1, wherein the recipe information has at least one step, wherein the at least step may include setting data for each process information including at least one selected from the group of a temperature set value, a gas flow rate set value, and a pressure set value, wherein the process data is at least one process data selected from the group of a temperature, a gas flow rate, and a pressure control, and is process monitor data sequentially reported by the monitor during the processing of the one substrate, and wherein the variation quality data is calculated from the process data in units of steps.

(Supplementary Note 5)

The substrate processing apparatus of Supplementary Note 1, wherein a t-test is performed using the variation quality data and the comparison data to calculate a probability value (p-Value), and wherein the reproduction index is obtained from the calculated probability value.

(Supplementary Note 6)

The substrate processing apparatus of Supplementary Note 1, wherein the validation of the reproduction index is determined based on the predetermined value.

(Supplementary Note 7)

The substrate processing apparatus of Supplementary Note 1, wherein the predetermined value indicates a threshold value of the reproduction index described in an apparatus parameter stored in the memory.

(Supplementary Note 8)

The substrate processing apparatus of Supplementary Note 1, further including: a display configured to be capable of displaying a processing status of the substrate.

(Supplementary Note 9)

The substrate processing apparatus of Supplementary Note 8, wherein when the reproduction index is below the predetermined value, the display is configured to display message data indicating that the reproduction index is below the predetermined value.

(Supplementary Note 10)

The substrate processing apparatus of Supplementary Note 1, wherein when the reproduction index is below the predetermined value, the controller uses the correction value to change a set value of a target recipe stored in the memory.

(Supplementary Note 11)

The substrate processing apparatus of Supplementary Note 2, wherein when the reproduction index is below the predetermined value, the communicator transmits a corresponding message to the external computer or the other external apparatuses.

(Supplementary Note 12)

The substrate processing apparatus of Supplementary Note 1, wherein when the reproduction index is equal to or exceeds the predetermined value, the analyzer determines that the comparison data has reproducibility.

(Supplementary Note 13)

According to another aspect of the present disclosure, there is provided a method of manufacturing a semiconductor device or a method of processing a substrate, including:

loading the substrate into a process chamber;

processing the substrate in the process chamber based on recipe information that describes a procedure for executing the processing of the substrate, and monitoring process data and storing the process data in a memory;

calculating variation quality data from a plurality of process data;

comparing the variation quality data with comparison data stored in the memory to obtain a reproduction index indicating the reproducibility of the comparison data, and calculating a correction value of setting information included in the recipe information when the reproduction index is below a predetermined value; and correcting the setting information included in the recipe information with the correction value.

(Supplementary Note 14)

According to still another aspect of the present disclosure, there is provided a non-transitory computer-readable storage medium storing a program that causes, by a computer, a substrate processing apparatus to perform a process, the process including:

loading a substrate into a process chamber;

processing the substrate in the process chamber based on recipe information that describes a procedure for executing the processing of the substrate, and monitoring process data and storing the process data in a memory;

calculating variation quality data from a plurality of process data;

comparing the variation quality data with comparison data stored in the memory to obtain a reproduction index indicating the reproducibility of the comparison data, and calculating a correction value of setting information included in the recipe information when the reproduction index is below a predetermined value; and correcting the setting information included in the recipe information with the correction value.

According to the present disclosure in some embodiments, it is possible to evaluate a production quality of processing by a substrate processing apparatus on the side of the substrate processing apparatus.

The above-described embodiment are merely an example, and therefore, the present disclosure is not limited to the above-described embodiments, but various modifications may be made without departing from the gist of the present disclosure. The various modifications are included in the technical idea of the present disclosure. Further, in the present disclosure, each constituent element may be present alone or in combination of two or more unless a conflict arises.

What is claimed is:

1. A substrate processing apparatus comprising:
a process chamber in which substrate processing is executed;
a memory that stores recipe information describing a procedure that executes the substrate processing, process data accumulated during executing a plural number of times processing of a substrate in the process chamber based on the recipe information, variation quality data calculated from the process data, and comparison data to be compared with the variation quality data;
a monitor configured to monitor the process data;
an analyzer configured to compare the variation quality data with the comparison data to obtain a reproduction index indicating a reproducibility of the comparison data, and calculate a correction value of setting information included in the recipe information when the reproduction index is smaller than a predetermined value; and
a controller that is capable of correcting the setting information included in the recipe information with the correction value.

2. The substrate processing apparatus of claim 1, further comprising: a communicator configured to communicate with an external computer or other external apparatuses,
wherein the comparison data is received from the external computer or the other external apparatuses via the communicator and is stored in the memory.

3. The substrate processing apparatus of claim 1, wherein the variation quality data is data obtained by obtaining a sum of differences per unit time between process data accumulated during the processing of one substrate and reference process data, and obtaining a mean value and an unbiased variance from a sum of differences for a plurality of substrates obtained by executing the processing of the substrate the plural number of times,
wherein the reference process data is process data obtained when a substrate is processed with a quality of a predetermined level or higher,
wherein the mean value is a result obtained by dividing the sum of differences for the plurality of substrates by a number of processed substrates, and
wherein the unbiased variance is a result calculated from the sum of differences and the mean value for the number of processed substrates.

4. The substrate processing apparatus of claim 1, wherein the recipe information has at least one step,
wherein the at least one step includes setting data for each process information including at least one selected from the group of a temperature set value, a gas flow rate set value, and a pressure set value,
wherein the process data is at least one process data selected from the group of a temperature, a gas flow rate, and a pressure control, and is process monitor data sequentially reported by the monitor during the processing of one substrate, and
wherein the variation quality data is calculated from the process data in units of steps.

5. The substrate processing apparatus of claim 1, wherein a t-test is performed using the variation quality data and the comparison data to calculate a probability value (p-Value), and
wherein the reproduction index is obtained from the calculated probability value.

6. The substrate processing apparatus of claim 1, wherein a validation of the reproduction index is determined based on the predetermined value.

7. The substrate processing apparatus of claim 1, wherein the predetermined value represents a threshold value of the reproduction index described in an apparatus parameter stored in the memory.

8. The substrate processing apparatus of claim 1, further including: a display configured to be capable of displaying a processing status of the substrate thereon.

9. The substrate processing apparatus of claim 8, wherein when the reproduction index is below the predetermined value, the display is configured to display message data indicating that the reproduction index is below the predetermined value.

10. The substrate processing apparatus of claim 1, wherein when the reproduction index is below the predetermined value, the controller uses the correction value to change a set value of a target recipe stored in the memory.

11. The substrate processing apparatus of claim 2, wherein when the reproduction index is below the predetermined value, the communicator transmits a message indicating that the reproduction index is below the predetermined value to the external computer or the other external apparatuses.

12. The substrate processing apparatus of claim 1, wherein when the reproduction index is equal to or exceeds the predetermined value, the analyzer determines that the comparison data has the reproducibility.

13. A method of manufacturing a semiconductor device, comprising:
executing a plural number of times processing of a substrate in a process chamber based on recipe information that describes a procedure that executes the processing of the substrate;
monitoring process data during executing the processing of the substrate the plural number of times and storing the process data in a memory;
calculating variation quality data from the process data;
comparing the variation quality data with comparison data stored in the memory to obtain a reproduction index indicating a reproducibility of the comparison data, and calculating a correction value of setting information included in the recipe information when the reproduction index is below a predetermined value; and
correcting the setting information included in the recipe information with the correction value.

14. A non-transitory computer-readable recording medium storing a program that causes, by a computer, a substrate processing apparatus to perform a process, the process including:
executing a plural number of times processing of a substrate in a process chamber based on recipe information that describes a procedure that executes the processing of the substrate;
monitoring process data during the executing the processing of the substrate the plural number of times and storing the process data in a memory;
calculating variation quality data from the process data;
comparing the variation quality data with comparison data stored in the memory to obtain a reproduction index indicating a reproducibility of the comparison data, and calculating a correction value of setting information included in the recipe information when the reproduction index is below a predetermined value; and correcting the setting information included in the recipe information with the correction value.

* * * * *